US009453146B2

(12) United States Patent
Sugimoto et al.

(10) Patent No.: US 9,453,146 B2
(45) Date of Patent: Sep. 27, 2016

(54) COVER TAPE

(71) Applicant: DENKA COMPANY LIMITED, Tokyo (JP)

(72) Inventors: Kazuya Sugimoto, Isesaki (JP); Hisatsugu Tokunaga, Isesaki (JP); Tadaaki Hirooka, Isesaki (JP)

(73) Assignee: DENKA COMPANY LIMITED, Tokyo (JP)

( * ) Notice: Subject to any disclaimer, the term of this patent is extended or adjusted under 35 U.S.C. 154(b) by 293 days.

(21) Appl. No.: 14/351,329

(22) PCT Filed: Oct. 12, 2012

(86) PCT No.: PCT/JP2012/076402
§ 371 (c)(1),
(2) Date: Apr. 11, 2014

(87) PCT Pub. No.: WO2013/054867
PCT Pub. Date: Apr. 18, 2013

(65) Prior Publication Data
US 2014/0248487 A1    Sep. 4, 2014

(30) Foreign Application Priority Data
Oct. 14, 2011   (JP) .................. 2011-226748

(51) Int. Cl.
*C08K 3/34* (2006.01)
*B32B 27/32* (2006.01)
(Continued)

(52) U.S. Cl.
CPC .............. *C09J 7/0296* (2013.01); *B32B 27/32* (2013.01); *B32B 27/34* (2013.01); *B32B 27/36* (2013.01);
(Continued)

(58) Field of Classification Search
CPC .... C09J 7/0296; B32B 27/32; C08K 3/0066; H01L 21/6836
See application file for complete search history.

(56) References Cited

U.S. PATENT DOCUMENTS

| 4,746,574 A | 5/1988 | Hattori et al. |
| 2003/0104308 A1* | 6/2003 | Shimomura ............. B41J 2/475 430/200 |

(Continued)

FOREIGN PATENT DOCUMENTS

| GB | 2 334 502 A | 8/1999 |
| GB | 2 346 128 A | 8/2000 |

(Continued)

OTHER PUBLICATIONS

International Search Report issued in International Application No. PCT/JP2012/076402 mailed Jan. 22, 2013.

(Continued)

*Primary Examiner* — Mark Kaucher
(74) *Attorney, Agent, or Firm* — Oliff PLC

(57) ABSTRACT

A cover tape having at least a base material layer, and an adhesive layer that is heat sealed by a resin carrier tape, the cover tape wherein the base material layer has an antistatic layer on a surface thereof that is on the reverse side to the adhesive layer; the antistatic layer contains at least an inorganic antistatic agent and a wax having a particle diameter of 0.2-3.0 μm; the inorganic antistatic agent is 40%-80% by mass and the wax content is 10%-50% by mass, relative to the total components forming the antistatic layer; and the surface resistivity of the base material layer side is no more than $10^{13} \Omega/\square$ in a 23° C.×30% RH atmosphere.

6 Claims, 2 Drawing Sheets

(51) Int. Cl.
   *C09J 7/02*     (2006.01)
   *B32B 27/34*    (2006.01)
   *B32B 27/36*    (2006.01)
   *H01L 21/683*   (2006.01)
   *C08K 3/00*     (2006.01)

(52) U.S. Cl.
   CPC ........ *H01L 21/6836* (2013.01); *B32B 2405/00* (2013.01); *C08K 3/0066* (2013.01); *C08K 3/34* (2013.01); *C09J 2203/326* (2013.01); *C09J 2205/106* (2013.01); *C09J 2491/006* (2013.01); *H01L 2221/68313* (2013.01); *Y10T 428/25* (2015.01)

(56) References Cited

U.S. PATENT DOCUMENTS

| | | |
|---|---|---|
| 2003/0124452 A1 | 7/2003 | Nair et al. |
| 2010/0247939 A1 | 9/2010 | Matsuzaki et al. |
| 2011/0212324 A1* | 9/2011 | Tokunaga ................ B32B 7/12 428/327 |

FOREIGN PATENT DOCUMENTS

| | | |
|---|---|---|
| JP | A-60-215039 | 10/1985 |
| JP | 61-78637 | 4/1986 |
| JP | A-4-367457 | 12/1992 |
| JP | A-8-119373 | 5/1996 |
| JP | 11-165364 | 6/1999 |
| JP | 2904613 B2 * | 6/1999 |
| JP | A-2000-280411 | 10/2000 |
| JP | A-2000-327024 | 11/2000 |
| JP | A-2004-1371 | 1/2004 |
| JP | A-2004-51105 | 2/2004 |
| JP | A-2004-255736 | 9/2004 |
| JP | A-2008-296447 | 12/2008 |
| JP | A-2009-40835 | 2/2009 |
| JP | A-2010-132927 | 6/2010 |
| JP | A-2011-63662 | 3/2011 |
| TW | 200942604 A | 10/2009 |

OTHER PUBLICATIONS

Jun. 23, 2016 Office Action issued in Taiwanese Application No. 10520780210.

* cited by examiner

COVER TAPE

TECHNICAL FIELD

The present invention relates to a cover tape used in packages for electronic components.

BACKGROUND ART

The miniaturization of electronic devices has been accompanied by advances in miniaturization and higher performance of the electronic components used therein, while at the same time, the assembly of electronic devices involves automatic mounting of electronic components on printed circuit boards. Such chip-type electronic components to be surface-mounted are housed in carrier tapes having receiving pockets thermoformed to the shapes of the electronic components formed consecutively thereon. After housing the electronic components in these receiving pockets, a cover tape is laid as a lid member over the top surface of the carrier tape, and the edges of the cover tape are continuously heat-sealed in the longitudinal direction using a heated sealing iron to form electronic component packages.

Cover tapes are cut to the widths of the carrier tapes to be heat sealed and wound continuously into rolls that are set in cover tape drawing portions of taping machines. When drawing out the cover tape, if the cover tape becomes stuck together front to back, resulting in the state generally known as blocking, then the cover tape cannot be stably drawn, and this can result in problems such as the components not being able to be stably loaded into the receiving pockets in the carrier tape, forcing the component loading line to stop. In other words, if cover tape is exposed to high-temperature or high-temperature high-humidity environments during transport or storage in roll form, they may undergo blocking in which the substrate layers on the front side or antistatic layers on the surface adhere to adhesive layers on the back side, and once blocking occurs, it usually cannot be undone even when the rolls are stored in a location where the temperature and humidity are controlled to be in an appropriate range. Additionally, depending on the type of resin constituting the adhesive layer, in addition to stopping the component loading line as mentioned above, there may be defects such as reduced antistatic performance due to the antistatic layer laminated on the substrate layer of the cover tape being transferred to the adhesive layer.

As countermeasures against blocking of cover tape, methods of adding an anti-blocking agent such as tin oxide, silica or aluminum silicate to the adhesive layer of cover tape (see Patent Documents 1-3), a method of adding an inorganic filler such as silica to an adhesive layer consisting of a polymethacrylic acid, polyester, polyurethane or vinyl chloride-vinyl acetate copolymer resin (see Patent Document 4) as well as a method of forming an antistatic anti-blocking layer consisting of a composition having a quaternary ammonium salt-type cationic surfactant dispersed in a urethane resin, an acrylic resin or a polyester resin (see Patent Document 5) have been proposed. However, these inventions provide insufficient blocking resistance when exposed to high-temperature or high-temperature high-humidity environments during transport or storage in the form of rolls.

In recent years, surface-mounted electronic components such as IC's, including transistors, diodes, capacitors and piezoelectric resistors, are inspected by inspection equipment for the presence or absence of electronic components, orientation of the components and lost or bent leads during the loading process. However, since most plastics have high electrical insulation properties, static electricity can easily accumulate and attract dust to the surface, which can prevent electronic components contained therein from being viewed clearly and force stoppages of the production line.

As a countermeasure against the above problem, an antistatic agent is often applied to the outermost surface of the cover tape.

As examples of antistatic agents that are commonly used, there are low molecular weight and polymeric antistatic agents such as surfactants that provide effects by adsorbing moisture from the air, but low molecular weight types may not be capable of obtaining sufficient antistatic performance to control adhesion of dust and particles which can be transferred to the surface opposite the coated surface when the tape is wound, thus having a detrimental influence on the performance. (Patent Document 6). Additionally, polymeric antistatic agents are susceptible to the influence of ambient humidity and moisture, and have reduced antistatic performance in low-humidity environments (in a 23° C.×20% RH atmosphere) (Patent Documents 7 and 8), making it difficult to maintain a sufficient antistatic performance.

Patent Document 1: JP H8-119373 A
Patent Document 2: JP 2000-280411 A
Patent Document 3: JP 2011-63662 A
Patent Document 4: JP 2000-327024 A
Patent Document 5: JP 2004-51105 A
Patent Document 6: JP 2009-40835 A
Patent Document 7: JP 2010-132927 A
Patent Document 8: JP 2008-296447 A

SUMMARY OF THE INVENTION

The main object of the present invention is to offer a cover tape capable of at least partially solving the above-described problems.

Additionally, another object of the present invention is to offer a cover tape in which blocking does not occur even when exposed to a high-temperature or high-temperature high-humidity environment, capable of maintaining stable antistatic performance even in low-humidity environments, and posing no problems during the process of housing electronic components in carrier tape.

The present inventors performed diligent research into this problem, as a result of which they discovered that the aforementioned problems can be solved by forming an antistatic layer comprising an inorganic antistatic agent and a wax on the surface, thereby achieving the present invention.

In other words, one embodiment of the present invention offers a cover tape comprising at least a substrate layer and an adhesive layer to be heat-sealed to a resin carrier tape; further comprising an antistatic layer on a surface of the substrate layer opposite to the adhesive layer; wherein the antistatic layer comprises at least an inorganic antistatic agent and a wax with an average particle size of 0.2 to 3.0 µm; the inorganic antistatic agent is in an amount of 40 to 80 mass %, and the wax is in an amount of 10 to 50 mass % with respect to all components constituting the antistatic layer; and a surface resistivity on a substrate layer side is $10^{13} \Omega/\square$ or less in an atmosphere of 23° C.×30% RH. Here, the surface resistivity on the substrate layer side refers to the surface resistivity on the surface of the substrate layer on the side of the aforementioned antistatic layer. Additionally, as long as the antistatic layer is provided on the surface side of the substrate layer and constitutes the surface layer of the cover tape, then other layers such as intermediate layers may be present between the substrate layer and the adhesive layer, and in fact, the presence of other layers such as intermediate layers is actually preferred in order to improve the strength.

In a preferred embodiment of the present invention, the inorganic antistatic agent is one or a combination of magnesium silicate and a smectite such as montmorillonite, beidelite, nontronite, hectorite and saponite, and in another preferred embodiment, the wax is one or a combination of vegetable-based carnauba wax, rice wax and candelilla wax, petroleum-based paraffin wax and microcrystalline wax, and olefin waxes, ester waxes, ketone waxes and amide waxes which are synthetic waxes.

Furthermore, in a preferred embodiment of the present invention, the antistatic layer comprises, as a binder component, a thermoplastic resin chosen from the group consisting of a polyurethane resin, an acrylic resin, a polyvinyl chloride resin, an ethylene-vinyl acetate resins, a polyester resin, a butadiene resin, a styrene resin, an acryl-modified polyester resin and combinations thereof; in another preferred embodiment, the adhesive layer comprises one or a combination of a polyurethane resin, an acrylic resin, a polyvinyl chloride resin, an ethylene-vinyl acetate resin, a polyester resin, a butadiene resin, a styrene resin including hydrogenated forms, and a polyolefin resin which is capable of being heat sealed to the resin carrier tape; and in yet another preferred embodiment, the substrate layer is a single layer or a laminate of plural layers of a resin film consisting of a polyester, a polyolefin or a nylon.

In yet another embodiment of the present invention, an antistatic layer or conductive layer may be provided on the surface side of the adhesive layer that can be heat-sealed to a carrier tape, and this antistatic layer on the adhesive layer side may be identical or different in composition from the antistatic layer provided on the surface of the substrate layer.

By forming an antistatic layer comprising an inorganic antistatic agent and a wax on the surface side of the substrate layer, the present invention offers a cover tape in which blocking does not occur even when exposed to a high-temperature or high-temperature high-humidity environment, capable of maintaining stable antistatic performance even in low-humidity environments, and posing no problems during the process of housing electronic components in carrier tape.

MODES FOR CARRYING OUT THE INVENTION

Herebelow, the structure of a cover tape according to an embodiment of the present invention will be explained with reference to the drawings.

Figure 1:
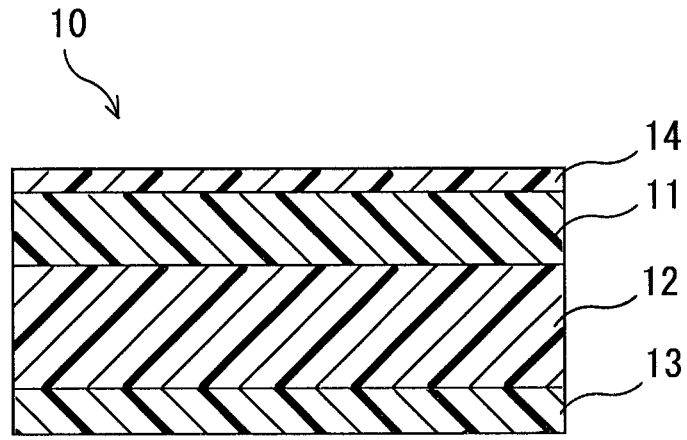
FIG. 1 A schematic section view showing the laminar structure of a cover tape according to an embodiment of the present invention.

As shown in FIG. 1, the cover tape 10 according to an embodiment of the present invention has a structure comprising a substrate layer 11, an intermediate layer 12 laminated on a back side of the substrate layer 11, an adhesive layer 13 laminated on a back side of the intermediate layer 12, and an antistatic layer 14 laminated on a surface of a front side of the substrate layer 11 opposite to the intermediate layer 12 (or adhesive layer 13).

The substrate layer is one or a laminate of plural layers of a resin film consisting of a polyester, a polyolefin or a nylon. Particularly preferred materials for the substrate layer 11 are biaxially stretched polyethylene terephthalate (PET), biaxially stretched polyethylene naphthalate (PEN), polypropylene, polyethylene and biaxially stretched 6,6-nylon and 6-nylon. As for the thickness of the substrate layer 11, if too thin, the tensile strength of the cover tape itself is too low and tearing easily occurs when peeling the cover tape, while if too thick, the heat-sealing ability to carrier tapes can decrease, so a thickness of 9 to 35 μm is preferred.

Examples of the resin constituting the intermediate layer 12 include low-density polyethylene, linear low-density polyethylene, very low density polyethylene, ethylene-propylene copolymer, ethylene-1-butene copolymer, ethylene-1-pentene copolymer, ethylene-1-hexene copolymer, ethylene-1-octene copolymer, ethylene-vinyl acetate copolymer, ethylene-acrylic acid ester copolymer and polyurethane, which can be used singly or as a mixture of two or more types. The thickness is preferably 10 to 50 μm, since at less than 10 μm, the tear strength is poor, and at more than 50 μm, there are problems in adhesiveness.

The adhesive layer 13 is formed of a thermoplastic resin having adhesiveness, and as the thermoplastic resin, one or a combination of a polyurethane resin, an acrylic resin, a polyvinyl chloride resin, an ethylene-vinyl acetate resin, a polyester resin, a butadiene resin, a styrene resin including hydrogenated forms, and a polyolefin resin is preferably used. There is no limit on the thickness of the adhesive layer 13 as long as it is within a range enabling an appropriate heat seal to be made with the carrier tape, and may, for example, be 5 to 40 μm.

The antistatic layer 14 comprises an inorganic antistatic agent and a wax. As the inorganic antistatic agent, magnesium silicate or a smectite, such as one or a combination of montmorillonite, beidelite, nontronite, hectorite and saponite is preferably used. The content of the inorganic antistatic agent with respect to all of the constituents of the antistatic layer should preferably be 40 to 80 mass %. At less than 40 mass %, it becomes difficult to achieve antistatic performance, and at more than 80 mass %, the contact with the substrate layer 11 becomes poor.

As the wax contained in the antistatic layer 14, it is preferable to use one or a combination of vegetable-based carnauba wax, rice wax and candelilla wax, petroleum-based paraffin wax and microcrystalline wax, and olefin waxes, ester waxes, ketone waxes and amide waxes which are synthetic waxes. The content of the wax with respect to all of the constituents of the antistatic layer should preferably be 10 to 50 mass %, more preferably 10 to 30 mass %, or 15 to 25 mass %. At less than 10 mass %, it becomes difficult to adequately prevent blocking, and at more than 50 mass %, the antistatic performance can be inhibited.

The wax is evenly dispersed in the antistatic layer 14 in the form of microparticles, the average particle size of which is 0.2 to 3.0 μm, preferably 0.5 to 3.0 μm. At less than 0.2 μm, sufficient anti-blocking performance cannot be obtained, and at more than 3.0 μm, the antistatic performance can be inhibited.

Additionally, as will be described below, the antistatic layer 14 is formed by preparing a coating solution containing an antistatic agent and a wax, and coating this onto the surface of a substrate layer 11, but the above-mentioned average particle size of the wax is the average particles size of wax particles in the wax dispersion contained in the coating solution, or strictly speaking the weight-average particle size, which can, for example, be measured by a Coulter counter or by microtracking.

The antistatic layer 14 may further contain a thermoplastic resin as a binder component. As the thermoplastic resin, it is preferable to use a polyurethane resin, an acrylic resin, a polyvinyl chloride resin, an ethylene-vinyl acetate resin, a polyester resin, a butadiene resin, a styrene resin or an acryl-modified polyester resin.

The thickness of the antistatic layer 14 should be 0.02 to 0.5 μm, preferably 0.05 to 0.3 μm, more preferably 0.05 to 0.2 μm. If the thickness of the antistatic layer is less than 0.02 μm, a sufficient antistatic performance may not be able to be achieved, while on the other hand, if the thickness of the antistatic layer exceeds 0.5 μm, cohesive failure of the antistatic layer may cause the antistatic layer itself to come free and cause problems as a contaminant. As will be explained below, the antistatic layer is normally formed by methods such as applying a solution into which the various constituents of the antistatic layer are dissolved or dispersed, or applying an emulsion containing the various constituents of the antistatic layer, but when coating, the thickness mentioned here is the thickness after drying.

Figure 2:
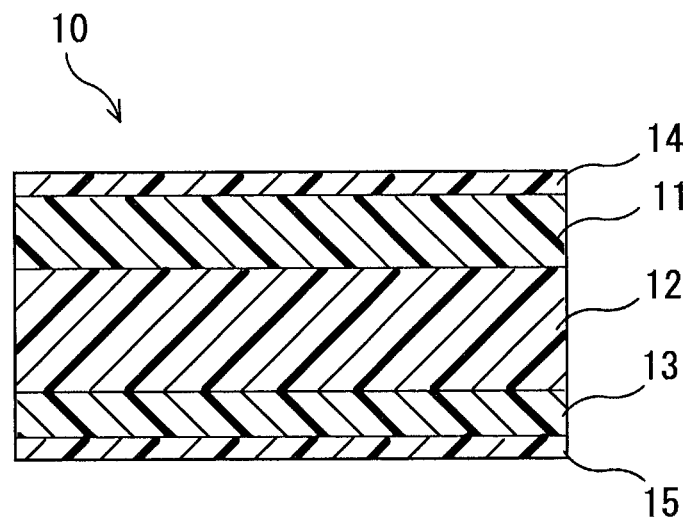
FIG. 2 A schematic section view showing the laminar structure of a cover tape according to another embodiment of the present invention.

FIG. 2 shows the structure of a cover tape according to another embodiment of the present invention, of which the portions that have the same structure as the cover tape 10 shown in FIG. 1 will be denoted by the same reference numbers as the reference numbers in FIG. 1 and their explanations will be omitted.

In the present embodiment, a further antistatic layer or conductive layer 15 is formed on the surface of the adhesive layer 13. While the same components as the antistatic layer 14 provided on the surface of the substrate layer 11 may be used for this further antistatic layer 15, it is also possible to use different components. In one embodiment, the antistatic agent in the antistatic layer 15 may be a cationic, anionic, non-ionic, amphoteric or polymeric antistatic agent. Additionally, when forming a conductive layer 15, the conductive agent may, for example, be conductive microparticles wherein sulfides such as zinc sulfide, copper sulfide, cadmium sulfide, nickel sulfide and palladium sulfide have been provided with conductivity, barium sulfide, metal oxides such as tin oxide, zinc oxide, indium oxide and titanium oxide, conductive carbon microparticles, silicon-containing organic compounds, or surface metal-plated microparticles. Furthermore, the further antistatic or conductive layer 15 may contain a thermoplastic resin to form the binder components, consisting of a polyurethane resin, an acrylic resin, a polyvinyl chloride resin, an ethylene-vinyl acetate resin, a polyester resin, a butadiene resin, a styrene resin including hydrogenated forms, an acryl-modified polyester resin and combinations thereof, and the antistatic layer or conductive layer 15 itself may be capable of heat sealing.

Figure 3:
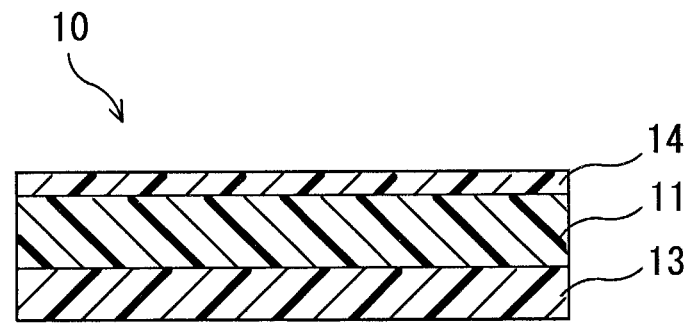
FIG. 3 A schematic section view showing the laminar structure of a cover tape according to yet another embodiment of the present invention.

FIG. 3 shows the structure of a cover tape according to yet another embodiment of the present invention. When compared with the structure of the cover tape shown in FIG. 1, it differs only in that the intermediate layer 12 is omitted from the cover tape 10 of FIG. 1.

In the cover tapes of the above embodiment shown in FIGS. 1 to 3, the overall thickness should preferably be in the range of 40 to 75 μm. At less than 40 μm, the cover tape can be torn during high-speed peeling, and at more than 75 μm, the sealing state can become unstable due to poor transmission of heat when heat-sealing the cover tape to a carrier tape, and the large disparity in peel strength when peeling the cover tape from the carrier tape.

Additionally, in the cover tape 10 according to the above embodiment, the peeling format when peeling the cover tape 10 from the carrier tape is not particularly limited, and it may be of any form including interfacial peeling wherein peeling is performed at the interface between the carrier tape and the adhesive layer 13 of the cover tape (in the case of FIGS. 1 and 3) or at the further antistatic layer or conductive layer 15 (in the case of FIG. 2), or cohesive peeling or interlayer peeling wherein peeling occurs by cohesive failure or at an interface within the structure of the cover tape 10.

Furthermore, the above cover tape 10 is such that all of the embodiments have an antistatic performance wherein the surface resistivity on the antistatic layer side 14 in an atmosphere at 23° C.×30% RH is $10^{13}\Omega/\square$ or less, preferably $10^{12}\Omega/\square$ or less. If the surface resistivity exceeds $10^{13}\Omega/\square$, then dust may adhere to the antistatic layer 14, and when housing components or mounting the components after peeling the cover tape 10 from the carrier tape, dust may adhere to the components and prevent the intended functions from being achieved.

The method for production of the cover tape is not particularly limited, and conventionally used methods may be used. For example, the substrate layer 11 and adhesive layer 13, and if an intermediate layer 12 lies between these layers, then the intermediate layer 12 as well, may be produced as a laminate by dry lamination or extrusion lamination. Next, the surface on the substrate layer 11 side of this laminate is coated with an antistatic layer 14, for example, with a gravure coater, a reverse coater, a kiss coater, an air-knife coater, a Meyer bar coater or a dip coater. For this coating, a dispersion solution comprising an antistatic agent, a wax and a thermoplastic resin or the like, especially one containing a uniform dispersion of a microparticulate wax with an average particles size in a predetermined range as mentioned above is prepared, and this is coated onto the laminate. Additionally, a similar coating method can be used when providing a further antistatic layer or conductive layer 15 on the adhesive layer 13 side.

When preparing the laminated structure, the contacting surfaces of the layers may be coated with an adhesive. Additionally, during coating, the wettability of the coating agent can be improved by applying a corona treatment or ozone treatment to the surface of the layer to be coated before coating as needed, and a corona treatment is especially preferred.

EXAMPLES

While the present invention will be explained in detail by means of examples below, these examples should not be construed as limiting the present invention in any way. The properties of the cover tape produced here were evaluated by the evaluation methods shown below.

(1) Anti-Blocking Property

Figure 4:
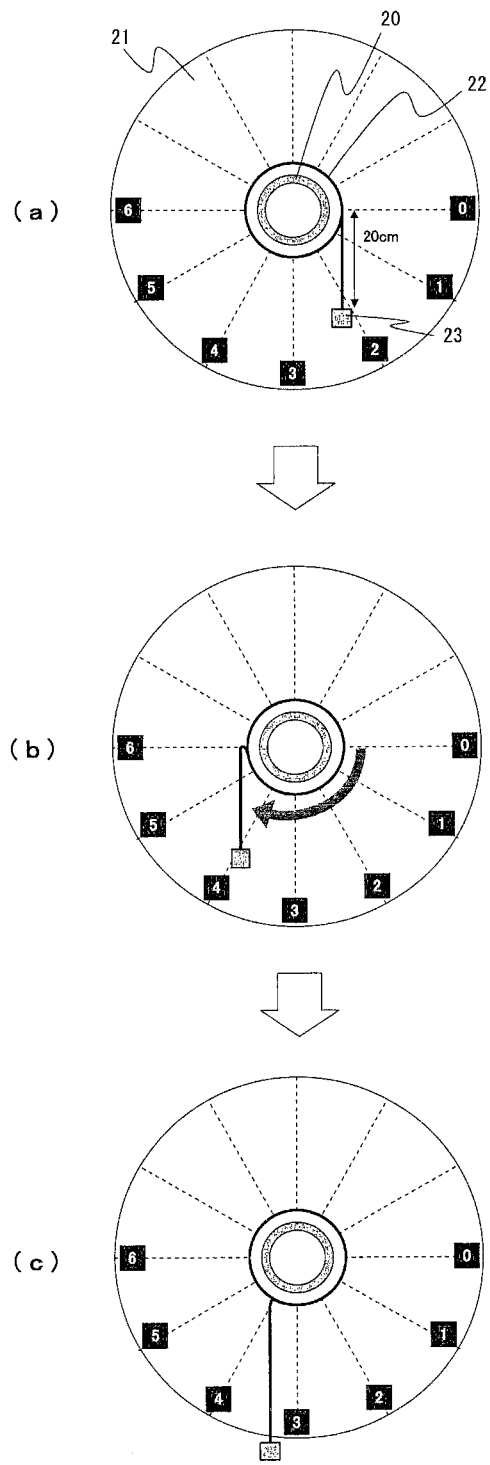
FIG. 4 A schematic diagram for explaining the method of evaluating the anti-blocking properties of the cover tape.

The anti-blocking evaluation method for the cover tape will be described with reference to FIG. 4.

A cover tape slitted to width 5.5 mm×length 500 m was wound record-wise onto a plastic core of diameter 93 mm with the antistatic layer side on the substrate layer surface facing outward, then placed for 24 hours in a 60° C. dry environment and a 40° C.×90% RH environment respectively. After removal from the respective environments, the cover tapes were let stand for 1 hour in a 23° C.×50% RH environment, then drawn out in the same 23° C.×50% RH environment and cut while leaving 20 m on the core portions. After mounting the slitted product 22 on the core portion on a jig 21 so as to be able to draw out the tape in a clockwise direction as shown in FIG. 4, 20 cm of the cover tape was drawn out with the jig coming to rest at the "0" position (in FIG. 4, the 3 o'clock position by analogy to a clock face), and a weight 23 weighing 1 g was attached to the tip portion thereof (FIG. 4(*a*)). Next, the cover tape was rotated by 180° until the drawn-out portion came to rest at position "6" on the jig (in FIG. 4, the 9 o'clock position by analogy to a clock face) (FIG. 4(*b*)). Immediately after rotation, the drawn-out portion was allowed to be naturally peeled away from the wound cover tape by the 1 g weight 23, and the position where the drawn-out portion came to rest was read (for example, as shown in FIG. 4(*c*)).

According to this method, the score of "0" to "6" indicated by the weight 23 on the jig 21 represents the degree of blocking. In other words, a score of "6" indicates a blocked state, and as the score becomes smaller, the anti-blocking property is better. If the score is "0", then no blocking has occurred at all. Since this method is a very strict way to evaluate the anti-blocking property, a score of "3" or less can be considered to indicate a cover tape having an anti-blocking property.

(2) Surface Resistivity (23° C.×50% RH)

The slitted product was placed in the same environment as in the anti-blocking property evaluation, and similarly using a core portion, the surface resistivity on the antistatic layer side of the substrate layer surface was measured at an applied voltage of 500 V in a 23° C.×50% RH environment by the method of JIS K 6911 using a Mitsubishi Chemical Hiresta UP MCP-HT450.

(3) Surface Resistivity (23° C.×30% RH)

After letting stand for 24 hours in a 23° C.×30% RH atmosphere, the surface resistivity on the antistatic layer side of the substrate layer surface was measured at an applied voltage of 500 V in the same atmosphere, using the same measuring device as in (2) above.

Additionally, in the examples and the comparative examples, the following raw materials were used for the substrate layer 11, the intermediate layer 12, the adhesive layer 13, the antistatic layer 14 and the antistatic layer 15 formed on the surface of the adhesive layer (see FIG. 2).

(Raw Material of Substrate Layer 11)
Biaxially stretched polyethylene terephthalate film (Toyobo), thickness 12 μm (Raw Material of Intermediate Layer 12)
m-LLDPE: Harmorex NH745N (Japan Polyethylene)

(Resin of Adhesive Layer 13)
Styrene-butadiene block copolymer 1: Clearen (Denka; Vicat softening temperature 76° C.; styrene ratio 83 mass %)
Styrene-butadiene block copolymer 2: TR-2000 (JSR; Vicat softening temperature 45° C.; styrene ratio 40 mass %)
High-impact polystyrene: Toyostyrol E640N (Toyo Styrene; Vicat softening temperature 99° C.)
Ethylene-α-olefin random copolymer: Tafmer A (Mitsui Chemicals)
Acrylic resin: EC-242 (Shin-Nakamura Chemical; $T_g$=60° C.)

(Antistatic Layer 14)
Wax Component:
Chemipearl W500 (Mitsui Chemicals; aqueous dispersion of olefinic wax; solid part 40%; average particle size 2.5 μm (by Coulter counter))
Chemipearl W900 (Mitsui Chemicals; aqueous dispersion of olefinic wax; solid part 40%; average particle size 0.6 μm (by Coulter counter))
Chemipearl W100 (Mitsui Chemicals; aqueous dispersion of olefinic wax; solid part 40%; average particle size 3.0 μm (by Coulter counter))
Chemipearl W400 (Mitsui Chemicals; aqueous dispersion of olefinic wax; solid part 40%; average particle size 4.0 μm (by Coulter counter))
MYE-35G (Maruyoshi Chemical; aqueous dispersion of olefinic wax; solid part 35%; average particle size 0.2 μm)
Aqacer 498 (BYK; aqueous dispersion of paraffin wax; solid part 50%; average particle size 0.1 μm (by Hegman gauge))
Binder Resin:
Elitel KA3556 (Unitika; polyester resin; glass transition temperature 80° C.)
Inorganic Antistatic Agent:
Laponite S482 (Rockwood Additives; magnesium silicate; flakes (short side 1 nm; long side 25 nm))

(Antistatic Layer 15)
Antistatic Agent:
Bondeip PM (Konishi; quaternary ammonium acrylate ethylsulfuric acid)
Binder Resin:
NK Polymer MK-100EC-242 (Shin-Nakamura Chemical; glass transition temperature 55° C.; emulsion solution of methyl methacrylate-butyl acrylate random copolymer)
Anti-Blocking Material:
Aerodisp W630 (Nippon Aerosil; spherical alumina; average particle size 0.12 μm)

Example 1

42.5 mass % of the styrene-butadiene block copolymer "Clearen" (Denka), 22.5 mass % of the styrene-butadiene block copolymer "TR-2000" (JSR), 25 mass % of the ethylene-α-olefin random copolymer "Tafmer A" (Mitsui Chemicals) and 10 mass % of the high-impact polystyrene Toyostyrol "E640N" (Toyo Styrene) were pre-blended in a tumbler, then kneaded at 210° C. using a uniaxial extruder of diameter 40 mm, to obtain a resin composition forming an adhesive layer (reference number 13 in FIG. 2) at a line speed of 20 m per minute. Using the resin composition of this adhesive layer, a film was formed by an inflation extruder to obtain a film with a thickness of 15 μm constituting an adhesive layer. Furthermore, a two-solution curing polyurethane anchor coating agent was applied to a biaxially stretched polyethylene terephthalate film (thickness 12 μm) constituting a substrate layer (reference number 11 in FIG. 2) using a roll coater, and a melted m-LLDPE "Harmorex NH745N" (Japan Polyethylene) to form an intermediate layer (reference number 12 in FIG. 2) was extruded to a thickness of 25 μm to form a laminated film (the laminate of reference numbers 11 to 13 in FIG. 2) by means of extrusion lamination. After subjecting both the substrate layer and the adhesive layer of the laminated film to a corona treatment, a dispersion solution formed by mixing together 60 mass % of an aqueous solution of an inorganic antistatic agent "Laponite S482" (Rockwood Additives), 25 mass % of Chemipearl W500 (Mitsui Chemicals) to form a wax component and 15 mass % of a polyester resin "KA3556" (Unitika) prepared beforehand by diluting with water so as to have a solid-part concentration of 3.5% was applied by a gravure coater to form an antistatic layer 1 (reference number 14 in FIG. 2) on the surface of the substrate layer to a coating thickness of 0.1 μm after drying, then a dispersion solution obtained by mixing 31 mass % of Bondeip PM (Konishi), 25 mass % of NK Polymer MK-100EC-242 (Shin-Nakamura Chemical) and 44 mass % of Aerodisp W630 (Japan Aerosil) prepared beforehand as the antistatic layer 2 (reference number 15 in FIG. 2) to be formed on the surface of the adhesive layer was coated by a gravure coater to a coating thickness after drying of 0.3 μm, to obtain a cover tape.

Examples 2-9 and Comparative Examples 1-9

Cover tapes of Examples 2-3 of the present invention and cover tapes of Comparative Examples 1 and 3-9 were produced in the same way as Example 1, except that the antistatic layers (reference number 14 in FIG. 2) were formed with the composition ratios shown in Table 1 and Table 2. Additionally, cover tapes of Examples 4-9 of the present invention and a cover tape of Comparative Example 2 were produced in the same way as Example 1, except that the antistatic layers were formed with the composition ratios shown in Table 1 and Table 2, and the adhesive layer (reference number 13 of FIG. 2) was formed by the acrylic resin "EC-242" (Shin-Nakamura Chemical).

The properties discussed above were determined for the cover tapes according to Examples 1-9 and Comparative Examples 1-9 described above. The results are shown together in Table 1 and Table 2.

|  |  |  | Ex 1 | Ex 2 | Ex 3 | Ex 4 | Ex 5 | Ex 6 | Ex 7 | Ex 8 | Ex 9 |
|---|---|---|---|---|---|---|---|---|---|---|---|
| Antistatic Layer | Mass % | Inorganic Antistatic Layer | 60 | 40 | 80 | 40 | 40 | 60 | 40 | 40 | 40 |
|  |  | Binder Resin | 15 | 30 | 10 | 10 | 10 | 15 | 10 | 40 | 50 |
|  |  | Wax Component | 25 | 30 | 10 | 50 | 50 | 25 | 50 | 20 | 10 |
| Particle Size of Wax Component (μm) |  |  | 2.5 | 2.5 | 2.5 | 2.5 | 3.0 | 0.6 | 0.6 | 0.6 | 0.2 |
| Substrate Layer |  |  |  |  |  |  | Polyester |  |  |  |  |
| Intermediate Layer |  |  |  |  |  |  | m-LLDPE |  |  |  |  |
| Adhesive Layer |  |  |  | Styrenic |  |  |  |  | Acrylic |  |  |
| Evaluated Properties etc. | Antistatic Layer Thickness; μm |  |  |  |  |  | 0.03 |  |  |  |  |
|  | Substrate Thickness; μm |  |  |  |  |  | 13 |  |  |  |  |
|  | Intermediate Layer Thickness; μm |  |  |  |  |  | 25 |  |  |  |  |
|  | Adhesive Layer Thickness; μm |  |  |  |  |  | 15 |  |  |  |  |
|  | Cover Tape Thickness; μm |  |  |  |  |  | 53 |  |  |  |  |
|  | (1) Anti-blocking | Hi-Temp | 1.0 | 1.0 | 0.5 | 0.5 | 0.5 | 2.5 | 1.5 | 2.5 | 3.0 |
|  |  | Hi-Temp/ Hi RH | 1.5 | 1.5 | 0.5 | 0.5 | 0.5 | 2.5 | 2.5 | 3.0 | 3.0 |
|  | (2) Surface resistivity (23° C. × 50% RH) Ω/□ |  | 1.9E+09 | 2.2E+11 | 3.2E+09 | 1.8E+11 | 5.2E+11 | 3.2E+10 | 4.7E+10 | 1.0E+10 | 1.0E+10 |
|  | (3) Surface Resistivity (23° C. × 30% RH) Ω/□ |  | 2.4E+10 | 8.4E+11 | 1.4E+10 | 5.1E+11 | 8.9E+11 | 6.8E+11 | 5.7E+11 | 7.4E+11 | 7.4E+11 |

|  |  |  | Co Ex 1 | Co Ex 2 | Co Ex 3 | Co Ex 4 | Co Ex 5 | Co Ex 6 | Co Ex 7 | Co Ex 8 | Co Ex 9 |
|---|---|---|---|---|---|---|---|---|---|---|---|
| Antistatic Layer | Mass % | Inorganic Antistatic Layer | 20 | 35 | 10 | 50 | 90 | 0 | 40 | 60 | 60 |
|  |  | Binder Resin | 40 | 20 | 50 | 45 | 10 | 60 | 5 | 15 | 15 |
|  |  | Wax Component | 40 | 45 | 40 | 5 | 0 | 40 | 55 | 25 | 25 |
| Particle Size of Wax Component (μm) |  |  | 2.5 | 2.5 | 2.5 | 2.5 | 2.5 | 2.5 | 2.5 | 4.0 | 0.1 |
| Substrate Layer |  |  |  |  |  |  | Polyester |  |  |  |  |
| Intermediate Layer |  |  |  |  |  |  | m-LLDPE |  |  |  |  |
| Adhesive Layer |  |  | Styrenic | Acrylic |  |  |  | Styrenic |  |  |  |
| Evaluated Properties etc. | Antistatic Layer Thickness; μm |  |  |  |  |  | 0.03 |  |  |  |  |
|  | Substrate Thickness; μm |  |  |  |  |  | 13 |  |  |  |  |
|  | Intermediate Layer Thickness; μm |  |  |  |  |  | 25 |  |  |  |  |
|  | Adhesive Layer Thickness; μm |  |  |  |  |  | 15 |  |  |  |  |
|  | Cover Tape Thickness; μm |  |  |  |  |  | 53 |  |  |  |  |
|  | (1) Anti-blocking | Hi-Temp | 2.0 | 6.0 | 5.0 | 6.0 | 6.0 | 1.0 | 0.5 | 0.5 | 6.0 |
|  |  | Hi-Temp/ Hi RH | 6.0 | 4.0 | 6.0 | 6.0 | 6.0 | 1.0 | 0.5 | 0.5 | 6.0 |
|  | (2) Surface resistivity (23° C. × 50% RH) Ω/□ |  | 3.0E+12 | 2.4E+12 | 1.4E+12 | 1.7E+10 | 1.5E+09 | 1.0E+14 | 2.1E+13 | 5.4E+13 | 5.9E+09 |
|  | (3) Surface Resistivity (23° C. × 30% RH) Ω/□ |  | 7.6E+13 | 6.7E+13 | 6.4E+13 | 3.7E+11 | 1.4E+10 | 1.0E+14 | 5.4E+13 | 1.0E+14 | 1.4E+11 |

As can be seen from these results, the cover tapes of Examples 1-9 all exhibit excellent anti-blocking properties in high-temperature environments and high-temperature high-humidity environments, and exhibit stable antistatic performance at low humidities. In contrast, the cover tapes according to Comparative Examples 1-9 did not achieve the desired level of performance in at least one of the anti-blocking properties in high-temperature environments or high-temperature high-humidity environments, or antistatic performance at low humidities.

INDUSTRIAL APPLICABILITY

The cover tape offered by the present invention solves problems such as production stoppages during the production process of housing electronic components in carrier tape using a taping machine or the inability to inspect the housed components, and specifically is capable of improving the electronic component housing efficiency by achieving drawing stability by suppressing blocking of the cover tape and providing stable antistatic performance even at low humidities.

DESCRIPTION OF THE REFERENCE NUMBERS 10 cover tape
11 substrate layer
12 intermediate layer
13 adhesive layer
14 antistatic layer
15 antistatic layer or conductive layer
20 plastic core
21 jig for evaluating anti-blocking performance
22 slitted core
23 load
1-6 anti-blocking score

The invention claimed is:

1. A cover tape comprising at least a substrate layer and an adhesive layer to be heat-sealed to a resin carrier tape; further comprising an antistatic layer on a surface of the substrate layer opposite to the adhesive layer; wherein the antistatic layer comprises at least an inorganic antistatic agent and a wax with an average particle size of 0.2 to 3.0 µm; the inorganic antistatic agent is in an amount of 40 to 80 mass %, and the wax is in an amount of 10 to 50 mass % with respect to all components constituting the antistatic layer; and a surface resistivity on a substrate layer side is $10^{13}\Omega/\square$ or less in an atmosphere of 23° C.×30% RH.

2. The cover tape of claim 1, wherein the inorganic antistatic agent is one or both of magnesium silicate and a smectite.

3. The cover tape of claim 1, wherein the wax is one or a combination of vegetable-based carnauba wax, rice wax and candelilla wax, petroleum-based paraffin wax and microcrystalline wax, and olefin waxes, ester waxes, ketone waxes and amide waxes which are synthetic waxes.

4. The cover tape of claim 1, wherein the antistatic layer comprises, as a binder component, a thermoplastic resin chosen from the group consisting of a polyurethane resin, an acrylic resin, a polyvinyl chloride resin, an ethylene-vinyl acetate resins, a polyester resin, a butadiene resin, a styrene resin, an acryl-modified polyester resin and combinations thereof.

5. The cover tape of claim 1, wherein the adhesive layer comprises one or a combination of a polyurethane resin, an acrylic resin, a polyvinyl chloride resin, an ethylene-vinyl acetate resin, a polyester resin, a butadiene resin, a styrene resin including hydrogenated forms, and a polyolefin resin which is capable of being heat sealed to the resin carrier tape.

6. The cover tape of claim 1, wherein the substrate layer is a single layer or a laminate of plural layers of a resin film consisting of a polyester, a polyolefin or a nylon.

\* \* \* \* \*